US008195997B2

(12) United States Patent
Poutas et al.

(10) Patent No.: US 8,195,997 B2
(45) Date of Patent: Jun. 5, 2012

(54) METHOD AND DEVICE FOR INPUTTING DIGITAL VALUES

(75) Inventors: Anne-Sophie Poutas, Colomiers (FR); Michel Colin, Colomiers (FR); Maria Julia Ulloa-Sanzo, Colomiers (FR)

(73) Assignee: Airbus Operations SAS, Toulouse (FR)

( * ) Notice: Subject to any disclaimer, the term of this patent is extended or adjusted under 35 U.S.C. 154(b) by 1385 days.

(21) Appl. No.: 11/722,334

(22) PCT Filed: Dec. 13, 2005

(86) PCT No.: PCT/FR2005/003109

§ 371 (c)(1), (2), (4) Date: Jun. 20, 2007

(87) PCT Pub. No.: WO2006/070089

PCT Pub. Date: Jul. 6, 2006

(65) Prior Publication Data

US 2010/0023848 A1 Jan. 28, 2010

(30) Foreign Application Priority Data

Dec. 22, 2004 (FR) .................................... 04 13716

(51) Int. Cl.
*H03M 13/00* (2006.01)
*G06F 11/00* (2006.01)

(52) U.S. Cl. ........................................ 714/746; 714/811

(58) Field of Classification Search .................... 714/52, 714/57, 746–747, 811; 701/3, 14, 16; 455/575.6, 455/565
See application file for complete search history.

(56) References Cited

U.S. PATENT DOCUMENTS

| | | | | |
|---|---|---|---|---|
| 6,289,207 | B1 | 9/2001 | Hudecek et al. | |
| 6,694,229 | B1 | 2/2004 | Gibbs | |
| 6,856,864 | B1 * | 2/2005 | Gibbs et al. | 701/3 |
| 7,607,066 | B2 * | 10/2009 | Gertz et al. | 714/758 |

OTHER PUBLICATIONS

International Search Report dated Apr. 4, 2006.

* cited by examiner

*Primary Examiner* — Shelly A Chase
(74) *Attorney, Agent, or Firm* — Dickinson Wright PLLC

(57) ABSTRACT

A device for inputting digital values includes a digital keyboard configured to be actuated by an operator for inputting figures of a particular digital value, display unit that displays at least the input figures, a validating unit configured to be actuated by the operator for validating a displayed digital value, and an input-aid system having an acquisition unit that acquires the input figures as they are being input and a processing unit that, knowing the digital values which are valid, determines at each input of one figure based on the valid digital values at least one auxiliary figure, which the processing unit associates with a set of already input figures to form a proposed value, and transmits the proposed value to the display unit.

17 Claims, 1 Drawing Sheet

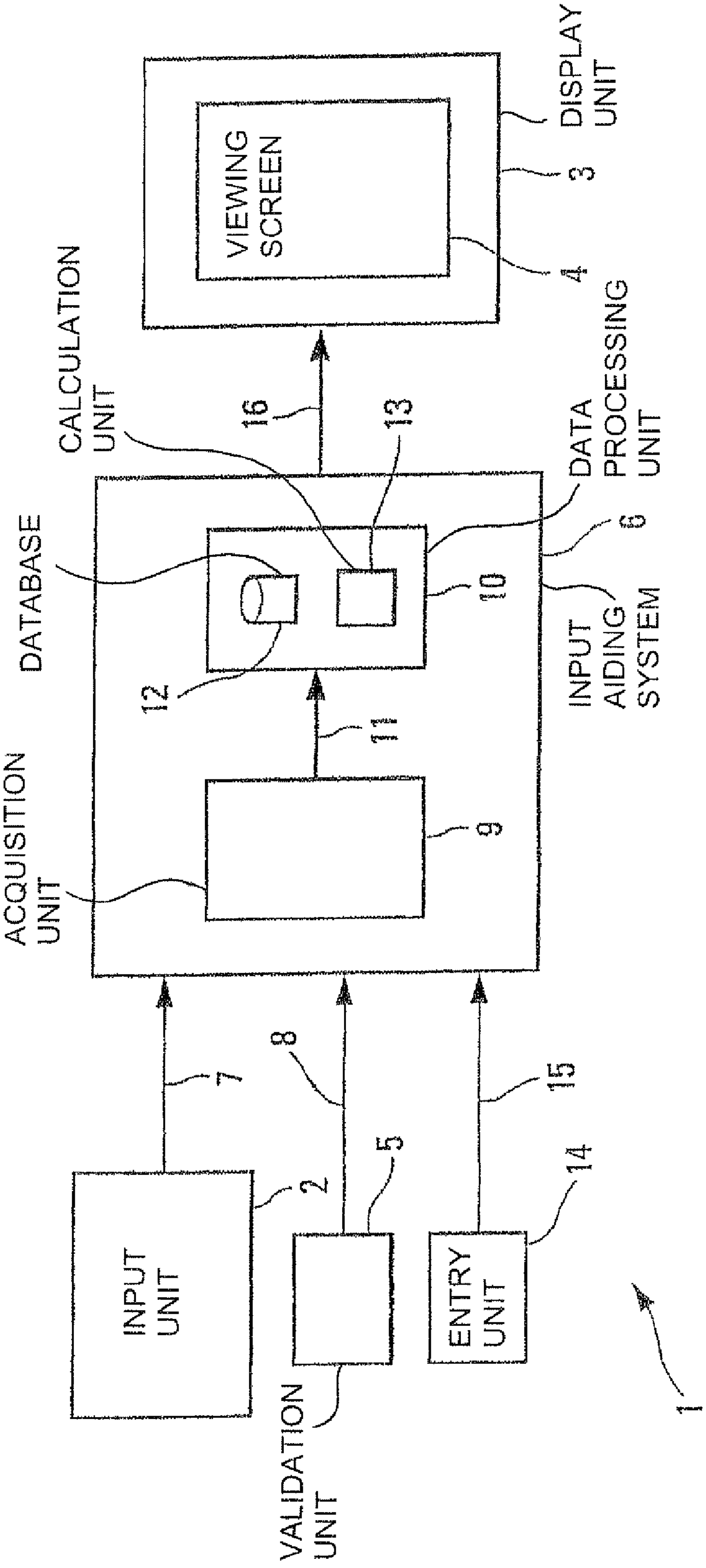
DISPLAY UNIT
3
VIEWING SCREEN
4
CALCULATION UNIT
16
13
DATA PROCESSING UNIT
6
DATABASE
10
INPUT AIDING SYSTEM
12
11
ACQUISITION UNIT
9
7
8
15
INPUT UNIT
2
5
14
VALIDATION UNIT
ENTRY UNIT
1

METHOD AND DEVICE FOR INPUTTING DIGITAL VALUES

FIELD OF THE INVENTION

The present invention relates to a method and device for inputting digital values.

BACKGROUND OF THE INVENTION

More precisely, the invention relates to the inputting of digital values which comprise a string of digits and which are situated in a predetermined range, only some of whose digital values are valid. This may involve in particular frequencies or channels of a standard means of radiocommunication, which is for example mounted on an aircraft, and in particular a radio intended to allow communication between the pilots of the aircraft and operators on the ground.

To do this, the input device generally comprises:

- a means of input able to be actuated by an operator, so as to input the digits of a particular digital value;
- a means of display for displaying all the digits input; and
- a means of validation able to be actuated by an operator, so as to validate a digital value thus displayed.

On a means of radiocommunication of an aircraft, the means of input is usually embodied in the form of a dual rotary switch (or dual-ring rotary knob). This dual rotary switch is furnished with a rotary ring of large diameter for selecting the integer digits and with a rotary ring of reduced diameter for selecting the decimal digits. However, the use of such a dual rotary switch for inputting radiocommunication frequencies on an aircraft poses, in particular, three types of problems for users:

a) the introduction of new channels generally entails a considerable increase in the number of digits to be input. The use of a dual rotary switch is not suitable in such a case, on account of the time required to find the appropriate frequency (overly large number of rotations);

b) in the presence of poor weather conditions, the vibrations felt in the flight deck of the aircraft make the use of a rotary switch difficult; and c) the cues transmitted by a ground control center often comprise only the significant digits of the frequency to be input. Now, the pilot must always input all the digits which form the frequency, and hence also the non-significant digits which are not transmitted to him by the control center. This situation may in particular pose a problem of comprehension for the pilot, which problem may be aggravated by the introduction of new radio channels on the aircraft.

SUMMARY OF THE INVENTION

The present invention is aimed at remedying these drawbacks. It relates to a method of inputting digital values (which comprise a string of digits and which are situated in a predetermined range, only some of whose digital values are valid), said method making it possible in particular to carry out fast and error-free inputs.

For this purpose, according to the invention, said method is noteworthy in that during the inputting of at least one digit by an operator, the following successive operations are carried out repeatedly and automatically, until the validation by this operator of a digital value presented:

a) each time the operator inputs a digit, when particular conditions specified below are realized, at least one auxiliary digit that is associated with the set of digits already input so as to form with them a proposal value is determined and proposed, as a function of said valid digital values; and b) said proposal value is presented to the operator, while differentiating the digits input from the digits proposed.

Thus, by virtue of the automatic proposal and automatic presentation of auxiliary digits (making it possible to form with the digits input, at least partially, a valid digital value), it is not necessary for the operator to input all the digits of the valid digital value to be input, thereby making it possible to reduce the duration of input, as well as the risk of error. Preferably, said digital values correspond to the various frequencies of a means of radiocommunication, which is for example mounted on an aircraft.

Advantageously, in step a):

- during the inputting of a single digit, this digit is placed in the first position from the left, at which this digit corresponds to the same digit situated in the same place on at least one digital value which is valid, and the positions situated on the left of this position are completed with the digits situated at the same positions on the smallest valid digital value, and/or
- when several digits are simultaneously possible for at least one position to the right of a digit input, this position is not completed.

Moreover, advantageously, on said proposal value presented in step b), the positions that are not completed by digits are also highlighted, as appropriate.

Furthermore, advantageously, in step a), the aforesaid particular conditions are considered to be realized:

- when a predetermined number of digits has been input; and/or
- when the possibilities of proposal of digits for at least one particular position are less than a predetermined number.

Additionally, advantageously:

- in step b), the differentiation rests upon the use of different fonts (characters); and/or
- during the inputting of an erroneous digit by an operator, a corresponding error message is issued.

The present invention also relates to a device for inputting digital values (which comprise a string of digits and which are situated in a predetermined range only some of whose digital values are valid).

According to the invention, said input device of the type comprising:

- a means of input able to be actuated by an operator, so as to input the digits of a particular digital value;
- a means of display for automatically displaying at least the digits input; and
- a means of validation able to be actuated by an operator, so as to validate a displayed digital value, is noteworthy in that said means of input is a digital keypad, and in that said input device moreover comprises a system for aiding input which is associated with said digital keypad and which comprises:

- a means of acquisition automatically effecting the acquisition of the digits input by an operator with the aid of said digital keypad, in tandem with the inputting of these digits; and
- a data processing means knowing said valid digital values and automatically determining, each time an operator inputs a digit, as a function of said valid digital values, at least one auxiliary digit which it associates with the set of digits already input so as to form with them a proposal value, said data processing means transmitting this proposal value to said means of display so that it displays it.

By virtue of the invention, said input device presents at least the following advantages, in particular as compared with a standard input device furnished with a rotary switch:

- faster and more reliable input, in particular owing to the use of a digital keypad;
- easier recollection (for the operator) of the digital value to be input;
- the possibility of inputting the digits in tandem with the receiving by the operator of the cue relating to these digits (thereby allowing the repetition of a cue such as an extent);
- easier input, in particular when it is necessary to input digital values (frequencies or channels, for example) with reduced spacings; and
- homogeneous input time without taking account of the target digital value, even in case of vibrations (due to turbulence for example) during input.

In a first variant, said data processing means comprises a database comprising the list of said valid digital values.

In a second variant, said data processing means comprises a means of calculation for automatically determining said valid digital values, as a function of particular data. In this case, preferably, the input device in accordance with the invention furthermore comprises a means of entry making it possible for an operator to enter said particular data, in particular the lower and upper limits of a range of frequencies, as well as a frequency increment (corresponding to the gap which is uniform between two successive frequencies).

Additionally, in a particular embodiment, said data processing means is able to detect any digit input which is erroneous and to transmit to the means of display, in case of detection of an erroneous input, a cue asking it to display a corresponding error message.

BRIEF DESCRIPTION OF THE DRAWINGS

The single FIGURE of the appended drawing will elucidate the manner in which the invention may be embodied. This FIGURE is the schematic diagram of an input device in accordance with the invention.

DETAILED DESCRIPTION OF THE INVENTION

The device 1 in accordance with the invention and represented diagrammatically in the FIGURE is intended to allow an operator to input digital values which comprise a string of digits and which are situated in a predetermined range, only some of whose digital values are valid. These valid digital values may correspond, in particular, to the frequencies or channels of a standard means of radiocommunication, and in particular of a means of radiocommunication which is mounted on an aircraft. Preferably, in this case this involves a radio intended to allow standard communications between the pilots of the aircraft (in particular of a transport plane) and operators of a control center situated on the ground.

To do this, said device 1 is of the type comprising:

- a means of input 2 able to be actuated by an operator, so as to input the digits of a particular digital value;
- a means of display 3 for automatically displaying, on a standard viewing screen 4, at least the digits input; and
- a means of validation 5, for example a knob, able to be actuated by an operator, so as to validate a digital value displayed on the viewing screen 4.

In a standard fashion, a digital value which is validated is taken into account by a system, for example a means of radiocommunication (not represented), which is associated with and controlled by said input device 1.

According to the invention, in particular so as to be able to carry out fast and error-free inputs:

- said means of input 2 is a digital keypad; and
- said input device 1 comprises, moreover, a system for aiding input 6 which is connected to said digital keypad 2 and to said means of validation 5 respectively by way of links 7 and 8.

According to the invention, said system for aiding input 6 comprises:

- a means of acquisition 9 automatically carrying out the acquisition of the digits input manually by an operator with the aid of said digital keypad 2, and doing so in tandem with the inputting of these digits; and
- a data processing means 10 which is connected by a link 11 to said means of acquisition 9, which knows the valid digital values, as specified hereinbelow, and which automatically determines at each input of a digit by an operator, as a function of said valid digital values, at least one auxiliary digit which is associated with the set of digits already input so as to form with them a proposal value. Said data processing means 10 subsequently transmits this proposal value automatically to said means of display 3, by way of a link 16, so that it displays it on the viewing screen 4.

Within the framework of the present invention, it is assumed that any digital value comprises a plurality of digits which are situated at particular positions in said digital value. Thus, for example, for the digital value "128":

- the digit "1" is situated in the first position starting from the left;
- the digit "2" is situated in the second position starting from the left; and
- the digit "8" is situated in the third and last position starting from the left, or in the first position starting from the right.

In a particular embodiment, during the inputting of a single digit, the data processing means 10:

a) places this digit in the first position P1 starting from the left, at which this digit corresponds to the same digit situated in the same place (position P1) on at least one digital value which is valid; and b) completes the positions situated to the left of this position P1 with the digits situated at the same positions on the smallest valid digital value [out of all the valid digital values which satisfy as appropriate the above characteristic a)], so as to form a proposal value which will be displayed on the viewing screen 4.

Furthermore, when several digits are simultaneously possible for at least one position P2 which is situated to the right of a digit input (that is to say when several valid digital values which comprise said digit input present different digits at said position P2), the data processing means 10 does not complete this position P2.

Consequently, in a proposal value, not all the positions are always completed with a digit (input or proposed).

Also, in a preferred embodiment, on any proposal value presented on the viewing screen 4, the means of display 3 also highlight as appropriate all the positions that are not completed with digits, for example by displaying a small horizontal stroke, as shown hereinbelow.

Furthermore, said means of display 3 differentiate a proposed digit from an input digit, preferably using different character fonts, thereby enabling them to be properly distinguished. Of course, other modes of differentiation (different colors, different graphics, etc.) are also possible within the framework of the present invention.

By way of example, the following display:

'129---' signifies that:

- the digits '1' and '9' (in small font) have been proposed by the data processing means 10;
- the digit '2' (in large font) has been input by an operator; and
- three positions (highlighted each time by '-') have not been completed.

In a particular embodiment, said data processing means 10 proposes digits only when particular conditions are realized. According to the invention, said particular conditions are considered to be realized:

- when a predetermined number of digits has been input for a particular value. Thus, by way of example, it is only onwards of the second (or third, etc.) digit input, that a proposal is made; and/or
- when the possibilities of proposal of digits, for at least one particular position, are less than a predetermined number. For example, beyond two (or three, etc.) possibilities, no proposal is made.

Furthermore, said data processing means 10 is able to detect any digit input (with the aid of the digital keypad 2) which is erroneous and to transmit to the means of display 3, in case of detection of an erroneous input, a cue requesting it to display a corresponding error message on the viewing screen 4.

As indicated previously, said data processing means 10 knows the digital values which are valid, that is to say which are able to be input with the aid of the input device 1.

In a first variant, said data processing means 10 comprises for this purposes a database 12, in particular integrated, comprising the list of all said valid digital values, for example the list of the various possible frequencies (or channels) of a radio.

In a second variant, said data processing means 10 comprises a means of calculation 13 for automatically determining said valid digital values, as a function of particular data. In this case, preferably, the input device 1 in accordance with the invention comprises, moreover, a means of entry 14, in particular a keypad, which is, for example, connected by a link 15 to the system 6 and which allows an operator to enter said particular data. In a particular embodiment, these particular data comprise the lower and upper limits of a range of frequencies, as well as a frequency increment (corresponding to the gap which is considered to be uniform between two successive frequencies), for example 25 Hz or 100 Hz, these data alone making it possible to determine all the valid digital values.

Said input device 1 in accordance with the invention presents numerous advantages, in particular:

- fast and reliable input, in particular owing to the use of a digital keypad 2;
- easier recollection (for the operator) of the digital value or frequency to be input;
- the possibility of inputting the digits in tandem with the receiving by the operator of the cue relating to these digits (thereby allowing the repetition of a cue such as an extent);
- easy input, in particular when it is necessary to input frequencies or channels with reduced spacings; and
- homogeneous input time without taking account of the target digital value or frequency, and even in the case of turbulence.

In a particular embodiment, the means of validation 5 and the means of entry 14 comprise keys and form part of the digital keypad 2.

Presented hereinbelow are two examples of inputs relating respectively to a RF means of radiocommunication of VHF ("Very High Frequency") type and to a means of high-frequency radiocommunication of HF ("High Frequency") type.

I. VHF Means of Radiocommunication

Frequency band: 118.000 to 136.975

118.000 to 136.755

Channel spacing: 25 kHz a/ The input device 1 proposes the first digits, according to the first digit input by an operator with the aid of the digital keypad 2:

If the first digit input is a '1', the input device 1 proposes and displays:

'1--.---'

Since there are too many possible choices after the '1', the input device 1 does not propose any solution for the positions to the right of said '1'.

If the second digit input is a '1', the input device 1 displays:

'11-.---'

If the second digit input is a '2'/'3', the input device 1 displays:

'12-.---'/'13-.---'

On the other hand, if the second digit input is an '8'/'9', the input device 1 proposes the hundreds and the decimals:

'118.000'/'119.000'

In this instance one is dealing with the valid frequency closest to the input.

If the first digit input is an '8'/'9', the input device 1 proposes the hundreds, tens and decimal digits:

'118.000'/'119.000'

As there are no other possible frequencies, the input device 1 proposes the integer part of the frequency directly.

If the first digit input is a '2'/'3', the input device 1 proposes the hundreds digit:

'12-.--'/'13-.---'

If the first digit input is neither '1', nor '2', nor '3', nor '8', nor '9', the input device 1 displays the input (which is therefore erroneous), it does not prevent the operator from continuing the input, but it also displays an error message, for example:

'VHFx ENTRY NOT VALID'.

For example, if the operator inputs as first digit a '4', the input device 1 therefore displays, in addition to the aforesaid error message:

'4--.---'

In a general manner, in case of input of an erroneous digit, the input device 1 displays the erroneous input, it does not prevent the operator from continuing the input, but it simultaneously displays an error message, for example:

'VHFx ENTRY NOT VALID'.

b/ Once at least three integer digits have been displayed on the viewing screen 4 (either because the digits have been fully input by the operator, or because some of them have been proposed by the data processing means 10), the input device 1 proposes that the frequency be terminated with '0's. At this juncture, if the operator continues the input, the input device 1 replaces each zero proposed by the digit input.

c/ In the case of a frequency gap of 25 kHz, if, in the position of the second decimal, the operator inputs a '2' or a '7', the input device 1 replaces the last '0' proposed by a '5'. Specifically, with a spacing between each channel of 25 kHz, the VHF frequencies terminate solely with 00, 25, 50 or 75.

For example:

the fourth digit input is a ‘4’, the input device 1 proposes and displays:

‘123.400’.‘123.400’ if the fifth digit is then a ‘2’/‘7’, the input device 1 proposes and displays:

‘123.425’. ‘123.475’

The operator can then validate this frequency without being obliged to input the last digit, this frequency being valid.

d/ In a general manner, as soon as all the digits of a digital value (frequency), input by an operator or proposed by the input device 1, are displayed on the viewing screen 4, the operator can validate this digital value (frequency) with the aid of the means of validation 5. The input is then terminated.

II. HF Means of Radiocommunication

Option 1: HF normal: from 2.800 to 23.999 MHz with 1 KHz of spacing

Option 2: HF optional: from 2.800 to 23.9999 MHz with 100 Hz of spacing

Contrary to the VHF frequencies, the input device 1 does not in this case always propose auxiliary digits as soon as the first digit is input, but it generally makes proposals onwards of the second digit input (specifically, the integer part of the HF frequency can comprise one or two digits), as in the following example.

A. Option 1: Spacing of the Channels of 1 kHz a/ If the first digit input is a ‘0’, the input device 1 displays:

‘0-.---’

For the following digit (second digit input), for example a ‘3’, the input device 1 erases the ‘0’, clears the display, and proposes completion with ‘0’s:

‘3.000’

If the second digit input is a ‘2’, the input device 1 proposes and displays:

‘2.800’

(This corresponds to the value of the start of the frequency band).

b/ If the first digit input is a ‘2’, the input device displays:

‘2-.---’

If the next digit (second digit input) is an ‘8’/‘9’, the input device 1 clears the display and proposes completion with ‘0’s:

‘2.800’/‘2.900’

If the next digit (second digit input) is neither an ‘8’ nor a ‘9’, but a valid digit after a ‘2’ (namely ‘0’, ‘1’, ‘2’ or ‘3’), the input device 1 keeps the display and proposes completion with ‘0’s, that is to say for a ‘1’ as second digit input:

‘21.000’ c/ If the first digit input is neither a ‘0’, nor a ‘1’, nor a ‘2’ (this digit possibly being between ‘3’ and ‘9’), the input device 1 clears the display and proposes the end with zeros:

‘7.000’

B. Option 2: Spacing of the Channels of 100 Hz a/ If the first digit input is a ‘0’, the input device 1 displays:

‘0-.----’

For the next digit (second digit input), for example a ‘3’, the input device 1 erases the ‘0’, clears the display, and proposes completion with ‘0’s:

‘3.0000’

If the second digit input is a ‘2’, the input device 1 proposes and displays:

‘2.8000’ b/ If the first digit input is a ‘2’, the input device 1 displays:

‘2-.----’

If the next digit (second digit input) is an ‘8’ or a ‘9’, the input device 1 clears the display and proposes completion with ‘0’s:

‘2.8000’

If the next digit (second digit input) is neither an ‘8’, nor a ‘9’, but a valid digit after a ‘2’ (namely ‘0’, ‘1’, ‘2’ or ‘3’), the input device 1 keeps the display and proposes completion with ‘0’s, that is to say for a ‘1’ as second digit input:

‘21.0000’ c/ If the first digit input is neither a ‘0’, nor a ‘1’, nor a ‘2’ (this digit possibly being between ‘3’ and ‘9’), the input device 1 clears the display and proposes completion with zeros:

‘6.0000’

The invention claimed is:

1. A method for inputting digital values which comprise a string of digits and which are situated in a predetermined range only some of whose digital values are valid, the method comprising, during the inputting of at least one digit by an operator, the following successive operations which are carried out repeatedly and automatically, until the validation by this operator of a digital value presented:

a) determining and proposing, when particular conditions are realized, at least one auxiliary digit that is associated with a set of digits already input so as to form with the set of digits a proposal value, as a function of said valid digital values; and b) presenting said proposal value to the operator, wherein:

step a) is implemented at each inputting of a digit by the operator;

in step a), when several digits are simultaneously possible for at least one position to the right of a digit input, at least one position to the right of the digit input is not completed;

in step a), during the inputting of a single digit, the single digit is placed in the first position from the left, at which the single digit corresponds to the same digit situated in the same place on at least one digital value which is valid, and the positions situated on the left of this position are completed with the digits situated at the same positions on the smallest valid digital value; and in step b), said proposal value is presented to the operator while differentiating the digits input from the digits proposed and while also highlighting the positions that are not completed by digits.

2. The method as claimed in claim 1, wherein in step a), the particular conditions are realized when a predetermined number of digits has been input.

3. The method as claimed in claim 1, wherein a number of proposal of digits for at least one particular position are less than a predetermined number.

4. The method as claimed in claim 1, wherein in step b), a differentiation rests upon the use of different fonts.

5. The method as claimed in claim 1, wherein, during an inputting of an erroneous digit by the operator, a corresponding error message is issued.

6. The method as claimed in claim 1, wherein said valid digital values correspond to various frequencies of a radio communication device.

7. A device for inputting digital values which comprise a string of digits and which are situated in a predetermined range only some of whose digital values are valid, said device comprising:

a digital keypad configured to be actuated by an operator, so as to input the digits of a particular digital value;

a display unit that is configured to automatically display at least the digits input;

a validation unit configured to be actuated by the operator, so as to validate a displayed digital value; and an input aiding system which is associated with said digital keypad and which comprises:

an acquisition unit that automatically effects the acquisition of the digits input by the operator with the aid of said digital keypad; and a data processing unit that knows said valid digital values and automatically determines, when particular conditions are realized, as a function of said valid digital values, at least one auxiliary digit which the data processing unit associates with a set of digits already input so as to form with the set of digits a proposal value, said data processing unit transmits the proposal value to said display unit so that said display unit displays the proposal value, wherein:

said acquisition unit effects the acquisition of the digits in tandem with the inputting of the digits;

said data processing unit forms a proposal value at each inputting of a digit by the operator, and, when several digits are simultaneously possible for at least one position to the right of a digit input, does not complete the at least one position to the right of the digit input; and said display unit presents said proposal value to the operator, while differentiating the digits input from the digits proposed and while also highlighting the positions that are not completed by digits.

8. The device as claimed in claim 7, wherein said data processing unit comprises a database comprising the list of said valid digital values.

9. The device as claimed in claim 7, wherein said data processing unit comprises a calculation unit that automatically determines said valid digital values, as a function of particular data.

10. The device as claimed in claim 9, further an entry enabling unit making it possible for the operator to enter said particular data.

11. The device as claimed in claim 7, wherein said data processing unit is configured to detect any digit input in case of detection of an erroneous input, a cue asking it to display a corresponding error message.

12. A method for inputting digital values which comprise a string of digits and which are situated in a predetermined range only some of whose digital values are valid, the method comprising, during the inputting of at least one digit by an operator, the following successive operations which are carried out repeatedly and automatically, until the validation by this operator of a digital value presented:

a) determining and proposing, when particular conditions are realized, at least one auxiliary digit that is associated with a set of digits already input so as to form with the set of digits a proposal value, as a function of said valid digital values; and b) presenting said proposal value to the operator, wherein:

step a) is implemented at each inputting of a digit by the operator;

in step a), when several digits are simultaneously possible for at least one position to the right of a digit input, at least one position to the right of the digit input is not completed; and in step b), said proposal value is presented to the operator while differentiating the digits input from the digits proposed and while also highlighting the positions that are not completed by digits, wherein said valid digital values correspond to various frequencies of a radio communication unit.

13. The method as claimed in claim 12, wherein in step a), during the inputting of a single digit, the single digit is placed in the first position from the left, at which the single digit corresponds to the same digit situated in the same place on at least one digital value which is valid, and the positions situated on the left of this position are completed with the digits situated at the same positions on the smallest valid digital value.

14. The method as claimed in claim 12, wherein in step a), the particular conditions are realized when a predetermined number of digits has been input.

15. The method as claimed in claim 12, wherein a number of proposal of digits for at least one particular position are less than a predetermined number.

16. The method as claimed in claim 12, wherein in step b), a differentiation rests upon the use of different fonts.

17. The method as claimed in claim 12, wherein, during an inputting of an erroneous digit by the operator, a corresponding error message is issued.

* * * * *